Dec. 20, 1966 H. D. G. SCHEFFER 3,293,500

PRINTED CIRCUIT BOARD WITH SEMICONDUCTOR MOUNTED THEREIN

Filed May 15, 1964 3 Sheets-Sheet 1

INVENTOR.
HARVEY D. G. SCHEFFER

BY [signature]
Attorney

PRINTED CIRCUIT BOARD WITH SEMICONDUCTOR MOUNTED THEREIN

Filed May 15, 1964 3 Sheets-Sheet 2

INVENTOR.
HARVEY D.G. SCHEFFER
BY Samuel Cohen
Attorney

INVENTOR.
HARVEY D. G. SCHEFFER
BY
Samuel Cohen
Attorney

United States Patent Office 3,293,500

Patented Dec. 20, 1966

3,293,500

PRINTED CIRCUIT BOARD WITH SEMICONDUCTOR MOUNTED THEREIN

Harvey Dow G. Scheffer, Westfield, N.J., assignor to Radio Corporation of America, a corporation of Delaware Filed May 15, 1964, Ser. No. 367,772
5 Claims. (Cl. 317—101)

This invention relates to printed circuits and to a method for mounting elements, such as semiconductor devices, in such circuits.

There are many applications these days in which electrical circuits are printed on insulating substrates, such as boards, cards or the like. These circuits include inactive components, such as conductors, resistors and the like, and often also include semiconductor elements, such as diodes, transistors and the like. Such circuits employed as memories are described in patent application Serial No. 294,283, filed July 11, 1963, by Morton H. Lewin, and assigned to the same assignee as the present application. Here, the substrates employed are cards made of paper, plastic or the like, which are relatively thin. Conductors and resistors are stenciled, silk-screened, printed, or otherwise formed on the cards. Connections between the resistors and conductors on a single card are achieved by overlapping the conductors with the end portions of the resistors. In addition, holes are punched in each card in order to disconnect certain of the connections previously made and, in this way, permanently to "write" binary information on the cards, as is discussed in detail in the application.

After the cards are prepared, they are stacked one over the other in the manner of a deck of cards. Connections between the memory circuits on the respective cards are achieved by riser columns which extend through the deck of cards. These riser columns are formed by placing a low temperature melting alloy into aligned holes in the cards, as is also discussed in the application.

In some embodiments of the memory system discussed in the application, each card includes one or more nonlinear circuit elements, such as diodes. If the diodes could be mounted so that they did not extend above the card surface, it would make simpler the problem of stacking the cards one over the other. However, so mounted, the diodes would still require to be held securely in place and in good electrical contact with the printed conductors on the card.

An object of the present invention is to provide a mounting arrangement for a semiconductor diode which has the attributes discussed above.

A more general object of the invention is to provide an improved printed circuit which includes one or more non-linear element.

Another object of the invention is to provide an improved method for mounting semiconductor devices, such as diodes, transistors, tunnel diodes, and the like, in a card or other insulating substrate.

In one form of the invention, a printed circuit element is located on the upper surface of an insulating substrate and a second printed circuit element is located on the opposite surface of the substrate. A hole positioned to pass through both printed circuit elements is formed in the substrate and printed circuit elements. Depressions are formed in opposite surfaces of the portion of the substrate surrounding the hole. A semiconductor element formed with a planar end cap which extends beyond the element is placed in the hole with the cap located in the depressed area. A second planar end cap is then placed in the opposite depressed area on the card and soldered or otherwise secured to the semiconductor element. The two planar end caps are the terminals of the semiconductor element and are in good electrical and mechanical contact with the circuit elements on the opposite surfaces of the card.

The invention is discussed in greater detail below and is shown in the following drawings, of which:

Figure 1:
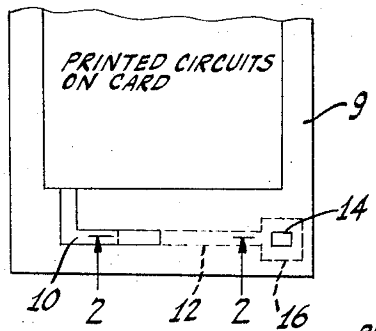
FIGURE 1 is a schematic plan view of a portion of a printed circuit card.
Figure 2:
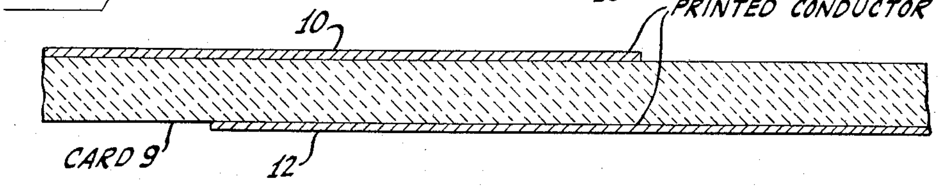
FIGURE 2 is a cross-section along line 2—2 of FIGURE 1.

The printed card 9 of FIGURES 1 and 2 may be similar to the card shown in the copending application above. The conductor 10 corresponds to the row lead 306 of the card shown in FIGURE 26 of the copending Lewin application. The lead 12, however, is on the underside of the card. The hole 14 passes through the card and through the terminal 16 for lead 12. This hole is the one in which the low temperature melting alloy is placed for connecting the leads corresponding to 12 on all cards in the stack (not shown) together.

As explained in the copending application, it is desired that a diode be placed on the card. This diode should be positioned to interconnect lead 10 with lead 12. Further, it would be desirable if the diode did not extend above the card surface. This would permit the cards easily to be stacked without requiring cut-outs in the cards immediately above the diode to permit the cards to lie flat.

Figure 3:
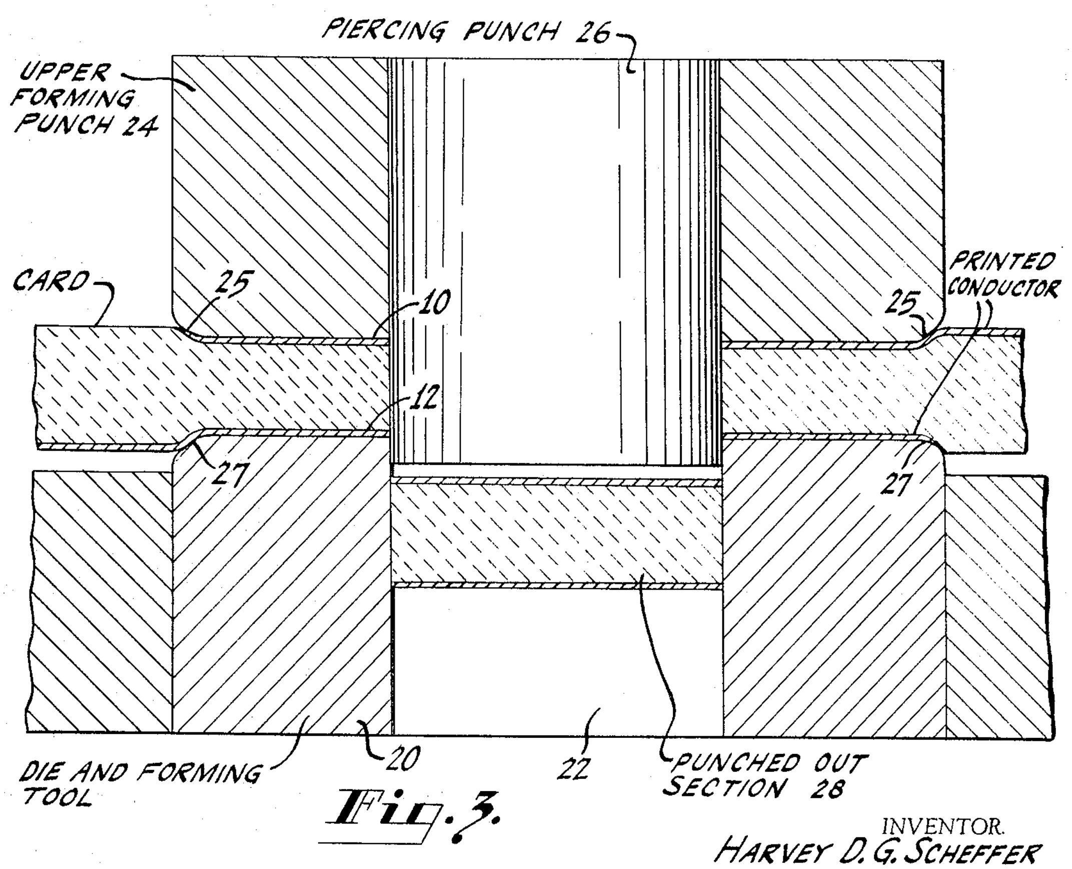
FIGURE 3 shows a step in the process of mounting an active element in the card.

FIGURE 3 illustrates one of the steps in the method of the present invention of mounting the diode. The card, only a portion of which is shown, is placed on a forming tool 20 which is formed with an aperture 22. A second forming tool 24 is placed against the upper surface of the card and pressure is applied between the forming tools 20 and 24 to compress the card in the area thereof where the conductors 10 and 12 lie over one another. The radius of curvature at the circumferential edges 25 and 27 of the upper and lower forming tools, respectively, is relatively large so that the transition between the depressed area and the remainder of the cards is gentle. This prevents the conductors from rupturing when pressure is applied between the forming tools.

A punch 26 located within the upper forming tool 24 is employed to punch a section 28 out of the card. The punching step may occur concurrently with the compression step or it may occur before or after the compression step.

Figure 4:
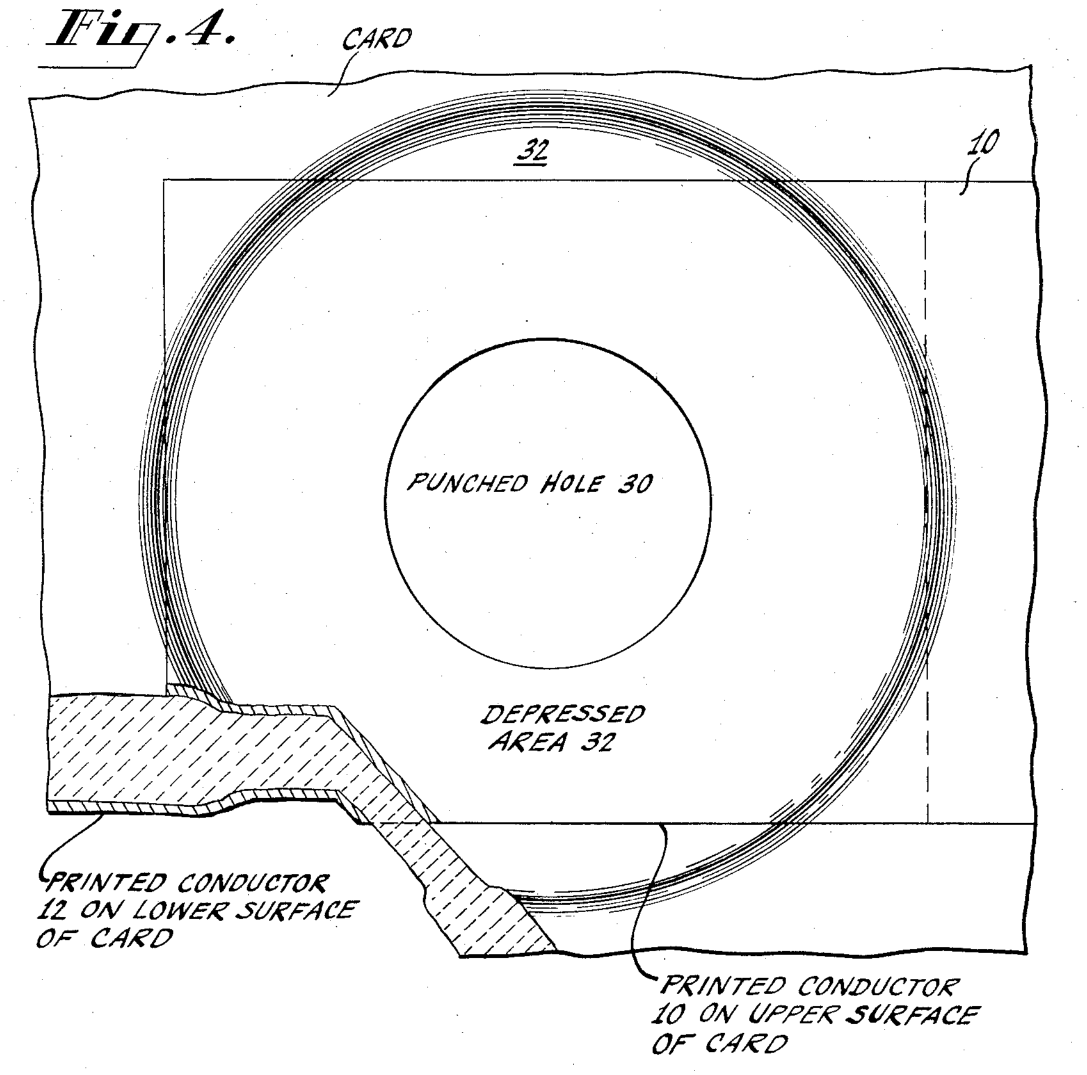
FIGURE 4 is a plan view of a portion of the card of FIGURE 3 which shows the appearance of the card after the step of FIGURE 3.

FIGURE 4 is a plan view of a portion of the card after the hole has been punched therein and the area 32 around the hole depressed. The hole 30 is somewhat smaller in diameter than the width of the printed conductors 10 and 12. The depressed area 32 surrounds the punched hole 30. The shape of the hole is shown to be circular in this example; however, in the general case, the shape of the hole will correspond to the cross-sectional configuration of the semiconductor to be placed in the card. Similarly, while the depressed area shown is circular, it will, in general, conform to the shape of the end cap on the semiconductor to be placed in the card.

The next step in the method is to insert a diode into the punched hole. The diode 33 is shown in cross-section in FIGURE 5 and in perspective view in FIGURE 6. The diode itself is preferably formed of a material such as silicon, and is of cylindrical shape. While the cylinder shown is of circular cross-section, it may be of square or other cross-section instead. The diode junction is indicated by the dashed line 34. A disc-shaped end cap 36 which serves as one terminal of the diode is soldered to one end surface of the diode. A second end cap (not shown in FIGURES 5 and 6, but shown at 46 in FIGURE 8) is later soldered to the other end surface of the diode. The end caps are preferably formed of a metal plated with gold or some other highly conducting, stable metal. A protective coating 37, such as one made of glass, plastic or the like, surrounds the circumferential surface of the diode. Any one of a number of well-known methods may be used to make a diode of such configuration, as is discussed briefly later.

Figure 7:
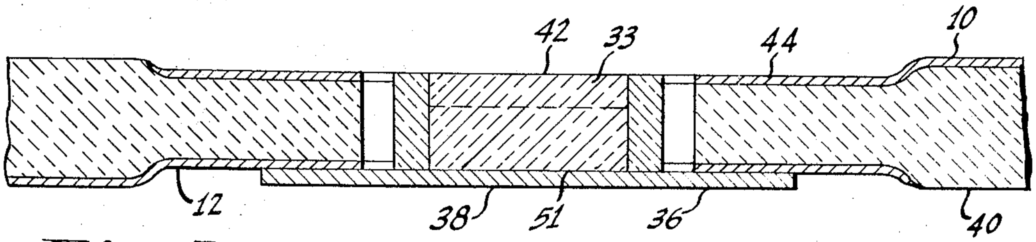
FIGURE 7 is a cross-section through the card showing the diode positioned in the card.

The diode 33, as it is initially positioned in the card, is shown in FIGURE 7. The disc-shaped end cap 36 is in mechanical and electrical contact with the printed conductor 12 on the lower surface of the card. The thickness of the end cap is such that its exposed surface 38 is essentially flush with the lower surface 40 of the card. The upper surface 42 of the diode is slightly lower than surface 44 of the upper depressed area.

As discussed shortly, prior to being soldered, the surfaces 42 and 51 of the diode are covered with a metal, such as nickel, which may be applied by plating in an electroless manner. Then the diode may be dip-soldered to cover the nickel plating with a thin coat of solder.

After cap 36 has been soldered to the diode and the diode is in place in the card, an upper metal disc 46 (FIGURE 8), made of the same material as the lower disc, is placed in the upper depression, on the diode. Then a soldering implement, which includes an outer cylindrical member 48 to hold the end cap 36, is placed concentric with the diode and centered on the upper printed conductor, and a soldering iron 50 within the cylinder 48 is positioned over the diode, as shown. The soldering iron is moved into contact with the upper disc and heat is applied. This causes the solder to melt and the end cap 46 to become soldered to the diode. This establishes electrical contact to the diode and the shrinking of the solder pulls the cap into tight mechanical and thus electrical connection to the printed conductors 10 and 12.

Figure 8:
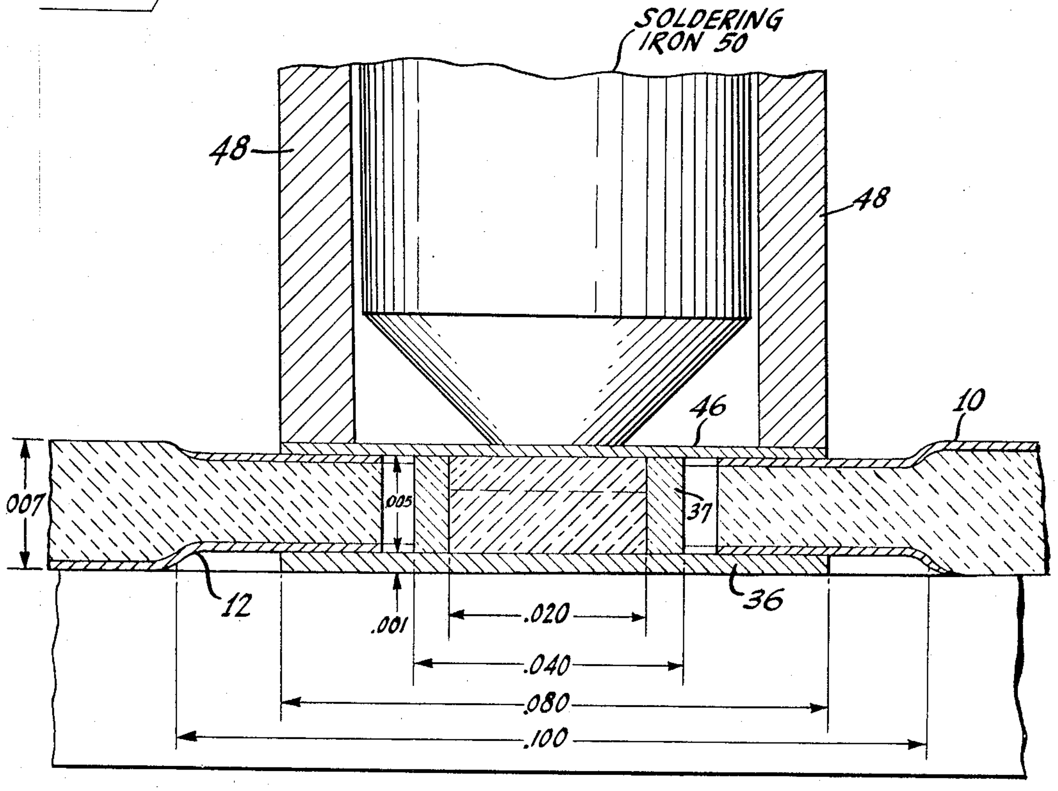
FIGURE 8 shows the way in which the second end cap is secured to the diode for completing the mounting of the diode on the card.

In the completed card shown in FIGURE 8, the end caps 46 and 36 for the diode are the anode and cathode terminals of the diode. These terminals are in good electrical and mechanical contact with the printed conductors 10 and 12. The end caps are substantially flush with the card surfaces.

It is preferable that the diodes on adjacent cards be staggered with respect to one another so that when the cards are stacked, a diode on one card bears against the paper on the cards immediately below and above. This serves two purposes. One is the protection of the diode by the paper of the adjacent cards. The other is to prevent electrical shorting, since the caps adjacent to each other on two successive cards may be of opposite polarity. The cards, when stacked, are under a certain amount of pressure, produced by the shrinking metal of the connecting risers, and in the card regions adjacent to the diodes, the cards bear against the end caps 36 and 46. In this way, these caps are maintained in good electrical contact with the printed conductors over a relatively large area. It is found not to be necessary to solder or weld the end caps to the printed conductors to insure good electrical contact.

The dimensions involved in a practical card are shown in FIGURE 8. Note that the drawing is not scaled.

The conductors on the card of the arrangement described are preferably formed of silver. The disc-shaped diode end caps are preferably formed of Kovar, coated with gold. However, neither of these features is critical to the invention. The particular metals used depend, in each case, upon the engineering requirements.

Figure 5:
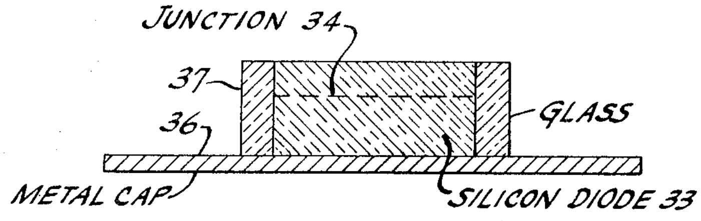
FIGURE 5 is a cross-section through a diode which is suitable for mounting in the card.
Figure 6:
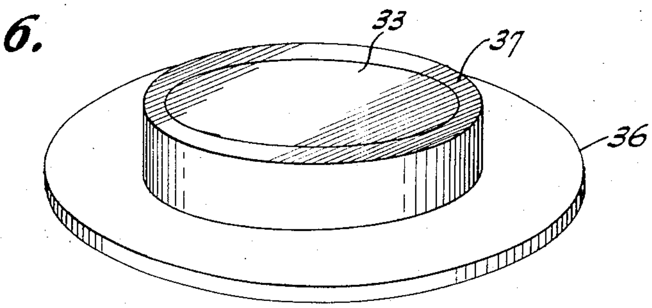
FIGURE 6 is a perspective view of the diode of FIGURE 5.

As previously mentioned, any one of a number of methods may be used for making the diode illustrated in FIGURES 5, 6 and 8. For example, the diode cylinders may be made individually by any one of many techniques which are available, and then encapsulated individually. After encapsulation, the diodes may be ground down and the ends plated with nickel and dip-soldered. Then one of the end caps may be soldered to the diode to provide the structure shown in FIGURES 5 and 6. Or the diode may be of the form described in Robillard, "Pinhead Diodes," Bell Laboratories Record, September 1963, page 303, provided planar end caps are added. However, it is preferred to mass produce the diodes in order to reduce costs.

In a preferred way of making the diodes, a crystal of silicon which is perhaps one inch square may be employed. A junction may be formed in this crystal in any one of a number of ways, parallel to one major surface of the crystal. Then raised mesas may be formed on the upper surface of the crystal, each including the junction. Then, glass may be melted onto the crystal so as to isolate the mesas from one another.

A number of the steps discussed above are similar to those described in copending application Serial No. 291,338, filed June 28, 1963, by E. F. Cave, and assigned to the same assignee as the present invention. However, in the present method, the junction is formed before the crystal is grooved or otherwise cut away to leave the raised mesas, and the junction is preferably substantially parallel to the crystal surface. (In the Cave method above, the junctions are formed after the mesas are produced and the junctions are not parallel to the crystal surface.)

After the steps above, the silicon crystal may be lapped to provide a structure similar to the one shown in FIGURE 6 of the copending Cave application, comprising individual diodes held to one another by glass. The lower and upper surfaces of this lapped element may then be plated with nickel by the electroless method and dip-soldered. Then a common gold-plated Kovar electrode may be soldered to the entire lower surface. Then the individual diodes may be cut, sawed or otherwise separated into individual elements on the common Kovar electrode. Then the electrode may be cut up to leave the individual diodes, each with an end cap, as shown in FIGURES 5 and 6 of the present application. The end cap may be circular, as shown, square, or of other shape. The depressed area formed on the card will, in general, be made to conform to the shape of the end cap.

In the embodiment of the invention chosen for illustration, the semiconductor device is a diode which exhibits only a positive resistance. It should be appreciated that the invention is equally applicable to other two-terminal devices, such as tunnel diodes, zener diodes or the like. The invention is also applicable to three- or more terminal devices, such as transistors or the like. With three-terminal devices, one of the end caps is split into two parts, one connecting to one of the electrodes, such as the base, and the other connecting to a second electrode, such as the emitter. The opposite end cap connects to the third terminal of the semiconductor device, such as the collector. In the case of three-terminal devices, the printed conductors are arranged so that when the device is in place, one conductor connects to one of the split end caps and the other conductor to the other split end cap. With four-terminal devices, both end caps may be split. Regardless of whether the device has two, three, or more terminals, the mounting principle involved, as discussed in detail herein, is the same.

In the embodiment of the invention illustrated, silicon diodes are employed. Other materials, such as germanium, gallium-arsenide and so on, may be used instead. Also, while the invention is illustrated in terms of a direct connection through a diode from one conductor to another, the invention is useful in other ways. For example, rather than using printed conductors, resistors, inductors or other printed circuit elements may be used instead, and planar end caps for the semi-conductor devices directly connected to the resistors or other printed elements. Resistors, for example, can be in the form of thin films which are stenciled or otherwise laid down just as the printed conductors are. Further, while in the form of the invention illustrated, the connection is a direct (ohmic) connection, if desired, the electrical connection may be of other type, such as capacitive instead. In a connection of the latter type, the conductor or other element is covered with a layer of insulation, as, for example, silicon monoxide, prior to the mounting of the diode on the substrate. The insulation acts as the dielectric element of the capacitive connection, the planar end caps (terminals) serve as one element of the capacitors, and the printed conductors serve as the other element of the capacitors.

In the embodiment of the invention discussed in detail above, the printed circuits are first placed on the card or other insulating substrate and then the semiconductor device is mounted in the substrate. The connection between the printed circuit and the semiconductor device occurs between the inner surface of the planar terminals and the printed circuits. It is also possible to mount the semiconductor device in the cards in the manner described in detail herein, prior to the time that the printed circuits have been laid down. After the device is in place in the "blank" card, the printed circuits are laid down and the connection to the device made by overlapping a printed circuit element, such as a conductor, over the exterior (exposed) surface of the planar terminals or from a printed circuit on an adjacent card in a stack.

What is claimed is:

1. In combination, an insulating substrate formed with printed means on opposite surfaces thereof, and with a hole through the means on said opposite surfaces and through the substrate, and a depressed area on both surfaces of the substrate surrounding the hole; and a device having a body of smaller cross-section than the hole and planar terminals of larger area than the hole which extend beyond the body, the device being located in said hole with its planar terminals in the depressed areas in electrical contact with the printed means and not extending above the depth of the depressed areas.

2. In combination, an insulating substarte formed with printed conductors on opposite surfaces thereof, and with a hole through the conductors and substrate, and a depressed area on both surfaces of the substrate surrounding the hole; and a semiconductor device having a body of smaller cross-section than the hole and planar terminals of larger area than the hole which extend beyond the body, the device being located in said hole with its planar terminals in the depressed areas in electrical contact with the printed conductors and not extending above the depth of the depressed areas.

3. In combination, a card formed with printed conductors on opposite surfaces thereof, and with a hole through the conductors and card, and a depressed area on both surfaces of the card surrounding the hole; and a semiconductor diode having a body of smaller cross-section than the hole and planar terminals of larger area than the hole which extend beyond the body, the diode being located in said hole with its planar terminals in the depressed areas in electrical contact with the printed conductors and not extending above the depth of the depressed areas.

4. In combination, an insulating substrate formed with a hole therein and a depressed area on both surfaces of the substrate surrounding the hole; and a semiconductor device having a body of the approximate thickness of the substrate at the edge of the hole, and having a cross-sectional configuration, in a plane through the device at right angles to the thickness dimension, smaller than that of the hole, and having secured thereto planar terminals of larger area than the hole which extend beyond the body, the device being located in said hole with its planar terminals in said depressed areas and not extending above the depth of the depressed areas, whereby said planar terminals hold said device in place.

5. In combination, an insulating substrate formed with a hole therein and a depressed area on both surfaces of the substrate surrounding the hole; and a semiconductor device having a body of a thickness substantially equal to that of the substrate at the edge of the hole, and having a cross-sectional configuration, in a plane through the device at right angles to the thickness dimension, smaller than that of the hole, and having secured thereto planar terminals of larger area than the hole which extend beyond the body, and a thickness substantially equal to the depth of the depressed areas, the device being located in said hole with its planar terminals in and not extending above the depth of said depressed areas, whereby said planar terminals hold said device in place.

References Cited by the Examiner

UNITED STATES PATENTS

| | | | |
|---|---|---|---|
| 2,989,669 | 6/1961 | Lothrop | 317—101 X |
| 3,142,783 | 7/1964 | Warren. | |

ROBERT K. SCHAEFER, *Primary Examiner.*

W. C. GARVERT, *Assistant Examiner.*